United States Patent
Lin et al.

(10) Patent No.: US 7,498,856 B2
(45) Date of Patent: Mar. 3, 2009

(54) FRACTIONAL-N FREQUENCY SYNTHESIZER

(75) Inventors: Chia-Liang Lin, Union City, CA (US); Gerchih Chou, San Jose, CA (US)

(73) Assignee: Realtek Semiconductor Corporation, Hsinchu (TW)

( * ) Notice: Subject to any disclaimer, the term of this patent is extended or adjusted under 35 U.S.C. 154(b) by 60 days.

(21) Appl. No.: 11/564,173

(22) Filed: Nov. 28, 2006

(65) Prior Publication Data
US 2007/0126484 A1 Jun. 7, 2007

Related U.S. Application Data

(60) Provisional application No. 60/742,583, filed on Dec. 5, 2005.

(51) Int. Cl.
*H03L 7/06* (2006.01)
(52) U.S. Cl. .................. 327/156; 327/157; 327/148
(58) Field of Classification Search ......... 327/148–150, 327/157–159
See application file for complete search history.

(56) References Cited

U.S. PATENT DOCUMENTS

| | | | |
|---|---|---|---|
| 5,818,303 A | 10/1998 | Oishi et al. | |
| 6,515,553 B1 * | 2/2003 | Filiol et al. | 332/127 |
| 6,836,526 B2 * | 12/2004 | Rana | 377/47 |
| 6,873,213 B2 * | 3/2005 | Tsuda et al. | 331/1 A |
| 6,917,317 B2 * | 7/2005 | Nagaso et al. | 341/131 |
| 6,960,947 B2 * | 11/2005 | Albasini et al. | 327/147 |
| 7,365,607 B2 * | 4/2008 | Fahim | 331/1 A |
| 2003/0222723 A1 | 12/2003 | Kawahara | |

FOREIGN PATENT DOCUMENTS

FR 2869173 10/2005

* cited by examiner

*Primary Examiner*—Kenneth B. Wells
*Assistant Examiner*—Hai L Nguyen
(74) *Attorney, Agent, or Firm*—Schwegman, Lunberg & Woessner, P.A.

(57) ABSTRACT

A circuit, with applications to phase-locked loops and frequency synthesis, where a divider circuit shuffles between dividing the output of a voltage-controlled oscillator by N or N+1, where N is an integer, and where a phase frequency detector provides three logic signals to a charge pump so that one of three values of current may be sourced to a loop filter, with the result that the circuit behaves as a conventional phase-lockup loop fictitious divider circuit that is capable of dividing the output of the voltage-controlled oscillator by a non-integral value.

16 Claims, 9 Drawing Sheets

FRACTIONAL-N FREQUENCY SYNTHESIZER

RELATED APPLICATIONS

This application claims the benefit of U.S. Provisional Application Ser. No. 60/742,583 filed Dec. 5, 2005, titled "Fractional-N Frequency Synthesizer and Method Thereof", which application is incorporated herein by reference.

FIELD

The present invention relates generally to circuits, and more particularly, to frequency synthesizers.

BACKGROUND

Figure 1:
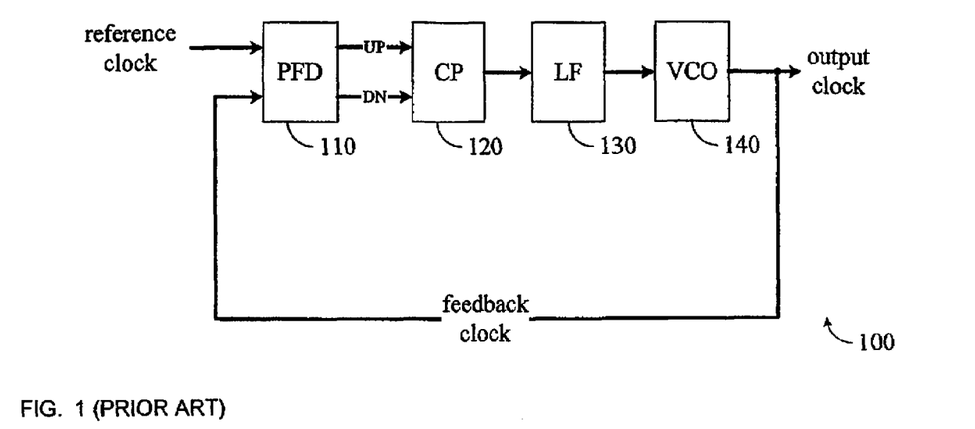
FIG. 1 shows a prior art phase-locked loop (PLL) circuit.

As depicted in FIG. 1, a typical phase-locked loop (PLL) 100 includes a phase frequency detector (PFD) 110, a charge pump (CP) 120, a loop filter (LF) 130, and a voltage-controlled oscillator (VCO) 140. The PFD 110 detects the phase difference between a reference clock and a feedback clock generated by the VCO. Usually, two logic signals, denoted in FIG. 1 as UP signal and DN signal, are used by the PFD 110 to represent the phase difference between the two clocks. Each time a phase comparison is made, an UP pulse, a DN pulse, or both, may be generated. If the reference clock is leading the feedback clock (e.g., the rising edge of the reference clock occurs before the rising edge of the feedback clock), an UP pulse is generated, and either no DN pulse is generated or a DN pulse shorter than the UP pulse is generated. If the feedback clock is leading the reference clock, a DN pulse is generated, and either no UP pulse is generated or an UP pulse shorter than the DN pulse is generated. The difference in the width between the UP pulse and the DN pulse is indicative of the phase difference between the two clocks.

The CP 120 receives the two logic signals UP and DN and converts them into a current signal. For example, the CP 120 generates a positive (e.g., out-going) current pulse in response to a UP pulse, and generates a negative (e.g., incoming) current pulse in response to a DN pulse. The output of the CP 120 is connected to the LF 130, which typically includes a resistor in series with a capacitor to convert the output current from the CP 120 into an output voltage. The output voltage from the LF 130 is passed to the VCO 140 and used to control the frequency and accordingly the phase of an output clock generated by the VCO 140. The output clock of the VCO 140 is used as the feedback clock and provided to the PFD 110. The PFD 110 then detects the phase difference between the reference clock and the feedback clock. A closed-loop control system is thus established to adjust the frequency, phase, or both of the output clock of VCO140 to track the frequency, phase, or both, of the reference clock. In steady state, the feedback clock is locked to and aligned with the reference clock; the output current signal of the CP 120 is zero or nearly zero; and the frequency of the output clock of VCO 140 will be the same as that of the reference clock.

Frequency synthesis is an important application of PLL. A frequency synthesizer works in the same manner as a general PLL shown in FIG. 1 and described above, except that a divide-by-N circuit (not shown in FIG. 1) is provided to process the output clock of the VCO 140 to generate the feedback clock, instead of directly using the output clock of the VCO 140 as the feedback clock. For every N cycles of the VCO 140 output clock, the divide-by-N circuit generates one cycle of the feedback clock. The PFD 110 then compares the phase of the feedback clock, which is the output of the divide-by-N circuit, with that of the reference clock and generate a phase difference signal represented by UP and DN. A closed-loop control system is thus established to adjust the frequency and phase of the output clock of VCO 140, and thus accordingly the frequency and phase of the feedback clock, to track the frequency and phase of the reference clock. In steady state, the feedback clock is locked to and aligned with the reference clock; the output current signal of the CP 120 is zero or nearly zero; and the frequency of the output clock of VCO 140 will be N times of that of the reference clock.

The divide-by-N circuit for frequency synthesizer may be conveniently implemented using a divide-by-N counter if N is an integer. If N is a fractional number, a straight implementation using a counter with a fixed divisor value will not work because the divisor value of a counter should be an integer. To implement a fractional N, say $N=N_{int}+\alpha$ where $N_{int}$ is an integer and $\alpha$ is a fractional number between 0 and 1, the divisor value for the counter is dynamically shuffled. For example, we may dynamically shuffle the divisor value between $N_{int}$ and $(N_{int}+1)$; the effective divisor value will be $N=N_{int}+\alpha$ if the probability (steady state frequency) of having the divisor value of $(N_{int}+1)$ is $\alpha$ and the probability (steady state frequency) of having the divisor value of $N_{int}$ is $(1-\alpha)$. In prior art circuits, a delta-sigma modulator is often used to dynamically shuffle the divisor value.

Dynamically shuffling the divisor value effectively achieves a fractional N division. However, these shuffling causes elongated UP and DN pulses, which results in elongated current pulses from the CP and consequently causes excessive phase changes to the output clock of the VCO. Prior art fractional-N synthesizers therefore suffer from excessive phase noises.

Accordingly, a circuit that effectively generates a virtual feedback clock as if generated by a fictitious fractional-N divider circuit would have utility.

SUMMARY

In an embodiment, a circuit is provided that includes: a voltage-controlled oscillator comprising an output port to provide an output clock signal, the circuit to provide a first feedback signal derived from the output clock signal; a divider circuit to provide a second feedback signal derived from the output clock signal divided by N+1 with a probability $\alpha$ and divided by N with a probability $1-\alpha$, where N is an integer; and a phase frequency detector to provide a first logic signal that is asserted at a rising edge of the reference signal, and to provide a second logic signal that is asserted at a rising edge of the second feedback signal, the phase frequency detector to sample the second logic signal at a rising edge of the first feedback signal to generate a third logic signal, where the third logic signal is sampled at a rising edge of the first feedback signal to generate a reset signal, where the first, second, and third signals are de-asserted after both the first and reset signals are asserted.

In an embodiment, a circuit includes: a loop filter; a charge pump responsive to a first logic signal, a second logic signal, a third logic signal, a signal indicative of a parameter $\epsilon$, where $0 \leq \epsilon \leq 1$, to source to the loop filter, a first amount charge, a second amount of charge, and a third amount of charge only if the first, the second, and third logic signals are asserted, respectively, wherein the sum of the first, second, and third amounts of charge is substantially zero regardless of the parameter $\epsilon$; a voltage-controlled oscillator coupled to the loop filter to provide an output clock signal; and a phase frequency detector responsive to a reference signal, a first feedback signal derived from the output clock signal, and a second feedback signal derived from the output clock signal and a parameter α, the phase frequency detector to provide the first, second, and third logic signals to the charge pump.

In an embodiment, a circuit is disclosed, the circuit comprising: a first flip flop clocked by a reference signal for generating a first logic signal; and a flip-flop train for generating a second and a third logical signals, the flip-flop train comprising at least a second, a third, and a fourth flip-flop for generating a first, a second, and a third intermediate signals, wherein each flip-flop of the flip-flop train is clocked either by one of a first feedback signal and a second feedback signal or by one of said intermediate signals, wherein the second logic signal and the third logic signals are chosen among said intermediate signals.

In an embodiment, a method of performing phase/frequency detection is disclosed, the method comprising: receiving a reference clock, a feedback clock, and a RF clock, the RF clocking having a fixed timing relationship with the feedback clock; asserting a first logical signal at a rising edge of the reference clock; generating N intermediate signals, where N>2, using a flip-flop train comprising at least three flip-flops, wherein each flip-flop of the flip-flop train is clocked either by one of the RF clock and the feedback clock or by one of said intermediate signals; asserting a second logic signal using one of said intermediate signals; asserting a third logic signal using one of said intermediate signals; ; and de-asserting the first and at least part of the intermediate signals after both the first logic signal and the third logic signal are asserted.

DESCRIPTION OF EMBODIMENTS

In the present disclosure, numerous specific details are provided, such as examples of apparatus, circuits, components, and methods, to provide a thorough understanding of embodiments of the invention. Persons of ordinary skill in the art will recognize, however, that embodiments of the invention may be realized without one or more of the specific details. In other instances, well-known details are not shown or described to avoid obscuring aspects of embodiments of the invention. In contrast with prior art phase frequency detector (PFD) circuit, which detects the phase difference between the reference clock and the physical feedback clock and thus inevitably detects excessive phase errors in fractional-N synthesizer applications, this description discloses a circuit that effectively compares the reference clock with a virtual feedback clock generated from a fictitious fractional-N divider. In steady state, the circuit behaves as if the virtual feedback clock is locked to, and aligned with, the reference clock, and therefore the resultant current signal from the charge pump (CP) following the PFD is close to zero.

Figure 2:
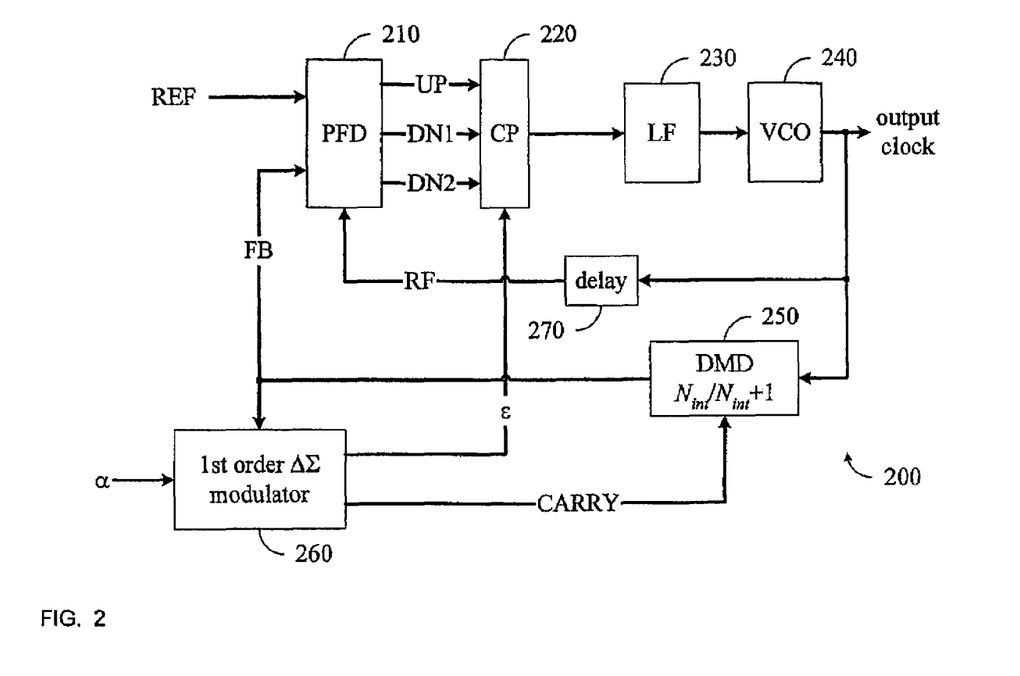
FIG. 2 shows a fractional-N synthesizer in accordance with an embodiment of the present invention.

FIG. 2 illustrates a fractional-N synthesizer 200 in accordance with an embodiment of the present invention. The fractional N value is $N=N_{int}+\alpha$, where $N_{int}$ is an integer and α is a fractional number smaller than one but no smaller than zero. The fractional-N frequency synthesizer 200 includes: a phase frequency detector (PFD) 210 receiving a reference (REF) clock, a feedback (FB) clock, and a radio frequency (RF) clock, and generating three logic signals UP, DN1, and DN2; a charge pump (CP) 220 receiving the three logic signals from the PFD 210 and a parameter ε and generating a current output; a loop filter (LF) 230 receiving the current output from the CP 220 and generating accordingly a voltage output; a voltage-controlled oscillator (VCO) 240 receiving the voltage output from the LF 230 and generating an output clock; a dual modulus divider (DMD) 250, having two divisor values $N_{int}$ and $N_{int}+1$, controlled by a CARRY signal, receiving the output clock from the VCO 240, and generating the FB clock; a $1^{st}$ order ΔΣ modulator 260, clocked by the FB clock, receiving a factional number α, and generating the parameter ε and the CARRY signal; and a delay circuit 270 receiving the output clock from the VCO 240 and generating the RF clock.

The DMD 250 performs a divide-by-$N_{int}$ function when the CARRY signal is 0, and performs a divide-by-($N_{int}+1$) function when the CARRY signal is 1. The CARRY signal is generated by the ΔΣ modulator, which shuffles the values of the CARRY signal so that the probabilities of the CARRY signal being 1 and 0 are α and (1−α), respectively. As well be described later in this disclosure, in steady state the effective current outputted to the LF 230 is nearly zero.

In the present disclosure it is to be understood that a signal referred to as a radio frequency signal, such as the RF signal in FIG. 2, is not necessarily a signal having a frequency that would be considered a radio frequency. Instead, as used herein, the term radio frequency is merely used to denote a signal provided to a phase frequency detector that has a higher frequency than another feedback signal provided to the phase frequency detector. For example, referring to FIG. 2, the radio frequency RF signal is the direct, but delayed, output of VCO 240, whereas the feedback signal FB is derived by dividing the output of VCO 240 by N or N+1. Accordingly, the frequency of the RF signal is higher than that of the FB signal. However, the frequency of the RF signal need not be that of a commonly understood radio frequency.

Figure 3:
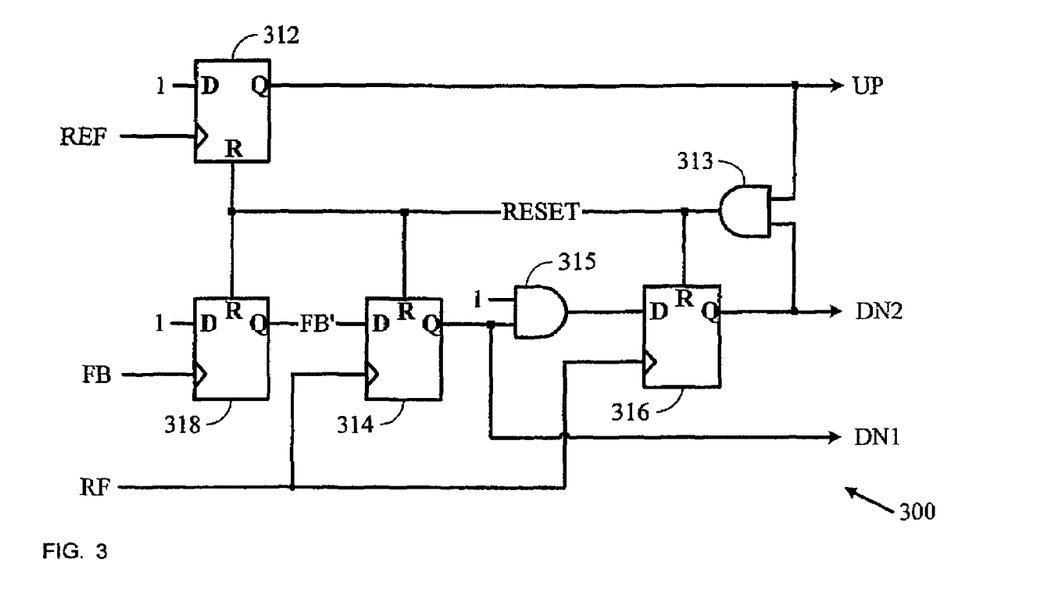
FIG. 3 shows a phase frequency detector (PFD) in accordance with an embodiment of the present invention.

FIG. 3 depicts a schematic diagram of a PFD 300 that is an embodiment of the PFD 210 in FIG. 2. PFD 300 receives a reference clock, a feedback clock, and a RF (radio frequency) clock, and generates accordingly three logic signals UP, DN1, and DN2 to represent the phase difference between the reference clock and a fictitious virtual feedback clock generated by a fictitious fractional-N divider. In the embodiment shown in FIG. 2, the RF clock is the output clock of the VCO 240. In another embodiment, the RF clock is divided down from the output clock of the VCO 240. In these cases, there is a relationship between the RF clock and the feedback clock because both clocks are derived from the output clock of the VCO 240.

The PFD 300 includes a first DFF (data flip flop) 312, a second DFF 318, a third DFF 314, a fourth DFF 316, a first AND gate 313, and an optional second AND gate 315. As used in this embodiment, a DFF has four terminals: input D, output Q, reset R, and trigger. DFF 312 is triggered by the reference clock (denoted by REF) and has a constant input of logic 1. It generates the UP signal that is asserted at the rising edge of the reference clock and stays high until a RESET signal resets DFF 312. DFF 318 is triggered by the feedback clock (denoted by FB) and has a constant input of logic 1. It generates a FB' signal that is asserted at the rising edge of the feedback clock and stays high until the RESET signal resets DFF 318. DFF 314 samples the FB' signal at the rising edge of the RF clock and generates accordingly the DN1 signal. The DN1 signal is thus asserted at the first rising edge of the RF clock after the FB' signal is asserted and stays high until the RESET signal resets DFF 314.

The DN1 signal is passed to the AND gate 315, which has two inputs: a constant input of logic 1 and the DN1 signal. The purpose of inserting the AND gate 315 is merely to provide loading to DFF 314 so that DFF 314 has the same output loading as DFF 312 and DFF 316. In terms of logic operation, AND gate 315 is transparent to the DN1 signal. AND gate 315 is thus optional. DFF 316 samples the output from AND gate 315 at the rising edge of the RF clock and generates accordingly the DN2 signal. AND gate 313 receives the UP signal and the DN2 signal and generates accordingly the RESET signal to reset DFF 312, 314, 316, and 318. In this manner, all four logic signals UP, FB', DN1, and DN2 are de-asserted shortly after both UP and DN2 signals become high.

Figure 4:
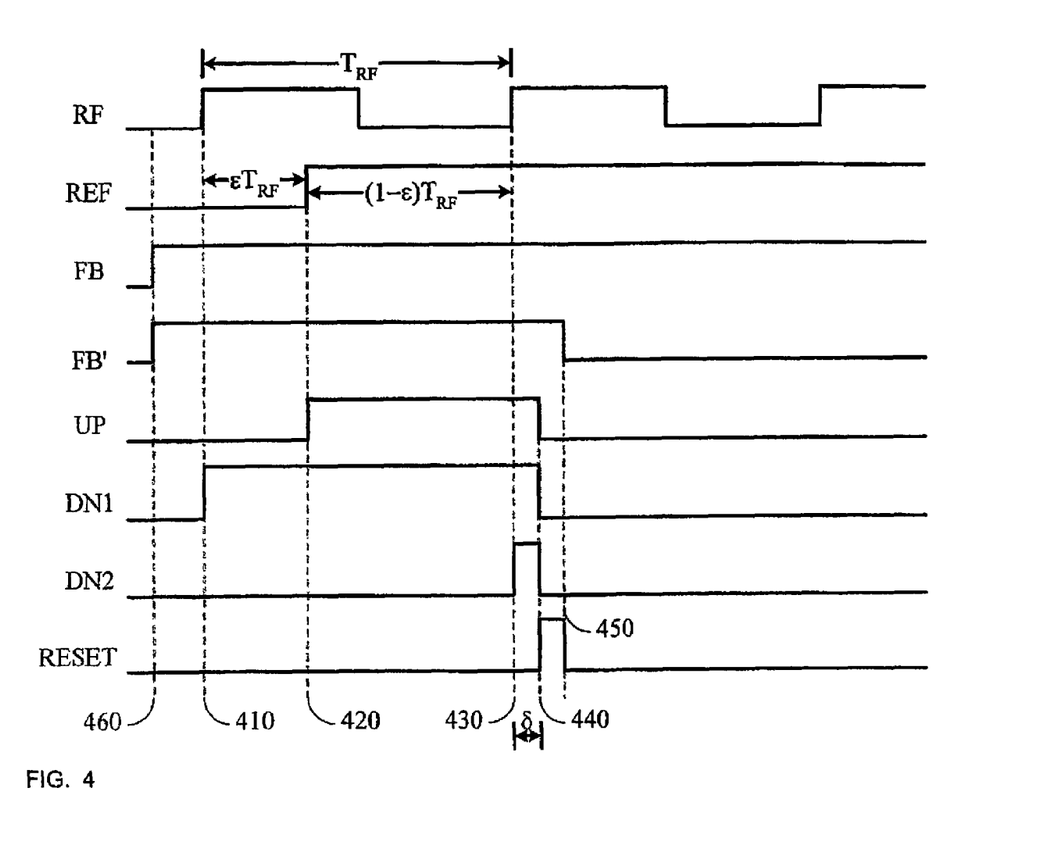
FIG. 4 shows a timing diagram for the PFD embodiment shown in FIG. 3.

FIG. 4 shows a typical timing diagram of the PFD 300 in FIG. 3 in steady state of the phase-locked loop where the PFD 300 is employed. The period of the RF clock is $T_{RF}$. The FB' signal is asserted at the rising edge 460 of the FB clock. The UP signal is asserted at the rising edge 420 of the REF clock. In accordance with an embodiment of the present invention, in steady state the first rising edge 410 of the RF clock following the rising edge 460 of the feedback (FB) clock always leads the rising edge 420 of the reference (REF) clock. A method to guarantee this timing relationship will be explained later in this disclosure. The FB' signal is sampled by the RF clock, resulting in the DN1 signal. The DN1 signal is thus asserted at the rising edge 410 of the RF clock. The DN1 signal is further sampled by the RF clock and results in the DN2 signal. The DN2 signal is thus asserted at the instant 430, which is the second rising edge of the RF clock following the rising edge 460 of the FB clock. The RESET signal is obtained from the logic AND operation on the UP signal and the DN2 signal. Due to circuit delay of the logic AND operation, the RESET signal is asserted at a later time instant 440 than the time instant 430 where DN2 is asserted. The timing difference between the time instant 430 and the time instant 440 is δ, which accounts for the circuit delay of the logic AND operation. The RESET signal then de-asserts signals FB', UP, DN1, and DN2 at the instant 440. After the de-assertion of signals FB', UP, DN1, and DN2, the RESET signal itself is also de-asserted at the instant 450. The timing difference between the time instant 440 and the time instant 450 accounts for the circuit delay of the logic AND operation.

The timing difference between the rising edge 410 of the RF clock and the rising edge 420 of the REF clock is $\epsilon \cdot T_{RF}$, where $0 \leq \epsilon < 1$. The timing difference between the rising edge 420 of the REF clock and the rising edge 430 of the DN2 pulse is thus $(1-\epsilon)T_{RF}$. The pulse length of UP is $((1-\epsilon)T_{RF}+\delta)$; the pulse length of DN1 is $(T_{RF}+\delta)$; and the pulse length of DN2 is δ. In steady state, a fictitious virtual feedback clock generated by a fictitious fractional-N divider is emulated. The emulated virtual feedback clock should have a rising edge aligned with that of the REF clock so that the effective current output from the subsequent CP (charge-pump) is zero.

Figure 5:
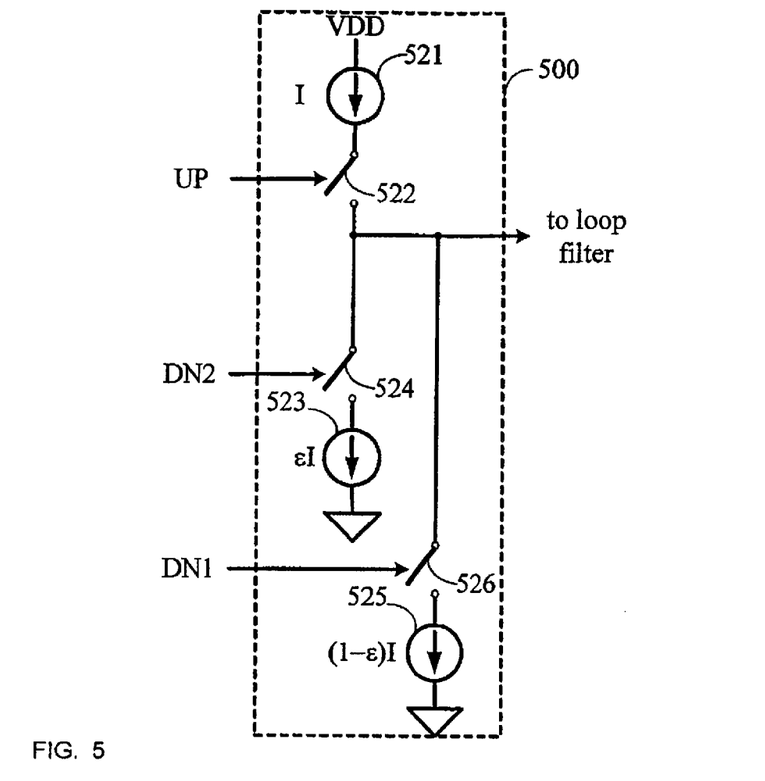
FIG. 5 shows a charge pump (CP) in accordance with an embodiment of the present invention.

FIG. 5 depicts a CP 500 that is an embodiment of the CP 220 in FIG. 2. CP 500 receives three logic signals UP, DN1, and DN2 from the preceding PFD (e.g. PFD 300 in FIG. 3), generates accordingly a current signal, and delivers the current signal to a loop filter. CP 500 includes a current source 521 of magnitude I, a first current sink 523 of magnitude $\epsilon \cdot I$, and a second current sink 525 of magnitude $(1-\epsilon)I$. The current source 521 is connected to the loop filter via a first switch 522 controlled by the UP signal; the first current sink 523 is connected to the loop filter via a second switch 524 controlled by the DN2 signal; and the second current sink 525 is connected to the loop filter via a third switch 526 controlled by the DN1 signal.

In steady state, the total charge delivered from the current source 521 to the loop filter is: (pulse length of UP) times I, equaling $I((1-\epsilon)T_{RF}+\delta)$; the total charge drained by the current sink 523 from the loop filter is: (pulse length of DN2) times $\epsilon \cdot I$, equaling $\epsilon \cdot I \cdot \delta$; and the total charge drained by the current sink 525 from the loop filter is: (pulse length of DN1) times $(1-\epsilon)I$, equaling $(1-\epsilon)I(T_{RF}+\delta)$. The total charge drained by the two current sinks from the loop filter is thus $\epsilon \cdot I \cdot \delta + (1-\epsilon)I(T_{RF}+\delta)$, equaling $I((1-\epsilon)T_{RF}+\delta)$. The charge delivered from the current source 521 is thus offset by the charges drained by the two current sinks 523 and 525. As a result, in steady state, the PFD 300, along with CP 500, effectively indicates no phase difference and no need to adjust the control voltage for the VCO. In this manner, a virtual feedback clock having the same timing as the REF clock is thus emulated. Note that the virtual feedback clock is not generated in an explicit manner but is implied by the operation of PFD 300 and CP 500.

Now refer back to FIG. 4, the timing difference between the REF clock and the first rising edge of the RF clock after the FB' signal is asserted is $\epsilon \cdot T_{RF}$. There should be a correct prediction of the timing of the REF clock, e.g., a correct estimation of the parameter ϵ. Once the correct value of the parameter ϵ is obtained, a virtual feedback clock is correctly implied by the operation of PFD 300 and CP 500 and the effective phase difference between the REF clock and the virtual feedback clock is zero. The method for obtaining the correct value for the parameter ϵ is disclosed as follows.

Figure 6:
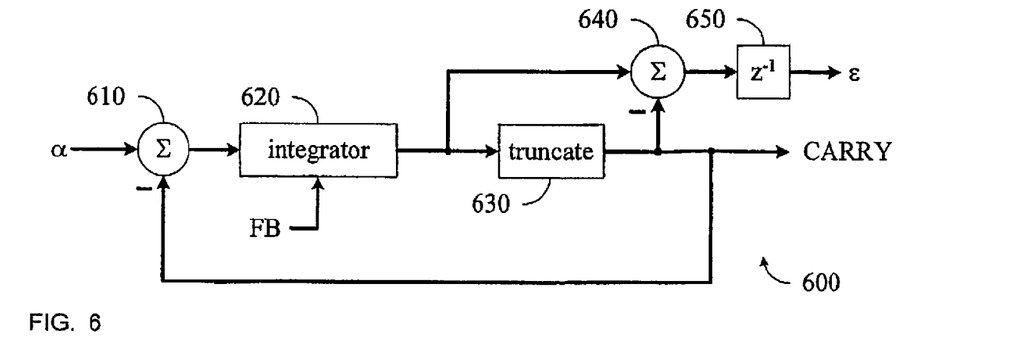
FIG. 6 shows an delta-sigma modulator in accordance with an embodiment of the present invention.

Now refer back to FIG. 2. The $1^{st}$ order ΔΣ modulator 260 calculates the timing of the virtual feedback clock, represents the timing using the parameter ϵ, and passes that parameter to CP 220. FIG. 6 illustrates a ΔΣ modulator 600, which is an embodiment of the ΔΣ modulator 260 in FIG. 2. In this embodiment, the $1^{st}$ order ΔΣ modulator 600 comprises: a first summation unit 610, an integrator 620 clocked by the FB clock, a truncate functional unit 630, a second summation unit 640, and a unit delay circuit 650.

The modulator input, e.g., the fractional number α, is the fractional part of the divisor value of the fictitious fractional-N divider. The value of the CARRY signal is subtracted from the fractional number α by summation unit 610, and is integrated by the integrator 620. The output of the integrator 620 is truncated by the truncate unit 630, resulting in the CARRY signal. Summing unit 640 subtracts the CARRY signal from the output of the integrator 620, and the parameter ϵ is taken from the output of the summing unit 640 after a unit cycle delay 650. The parameter $\epsilon$ thus represents the residual phase error between the virtual feedback clock and the physical clock.

Initially, the output of the integrator 620 in FIG. 6 is zero, and so is the CARRY signal. The initial divisor value of the DMD 250 in FIG. 2 is thus set to $N_{int}$. Initially, there is a phase error of $\alpha$ (normalized to the RF clock cycle) in the FB clock generated by DMD 250 because a virtual feedback clock should in theory have a divide-by-$(N_{int}+\alpha)$ timing while the physical feedback clock only has a divide-by-$N_{int}$ timing. In every FB clock cycle, an additional phase error of $\alpha$ is accrued. The accrued phase error is calculated using integrator 620. When the accumulated phase error exceeds 1 (e.g., after one full RF clock cycle), the output of the integrator 620 exceeds 1, and the CARRY signal becomes 1, causing the DMD 250 in FIG. 2 to perform a divide-by-$(N_{int}+1)$ task. This causes the FB clock to have an extra delay of a RF clock cycle. In this manner, the residual phase error $\epsilon$, obtained from subtracting the value of the CARRY signal from the output of the integrator 620, is bounded to smaller than 1 but no smaller than 0. Therefore, the timing of the virtual feedback clock implied by the PFD 210 and CP 220 (in FIG. 2) is always bounded within a full RF clock cycle relative to the physical feedback clock.

Now refer back to FIG. 2, the 1$^{st}$ order delta-sigma modulator 260 calculates the residual phase error $\epsilon$, in a manner in accordance with the embodiment of modulator 600 illustrated in FIG. 6 and described above, and then provides the value of $\epsilon$ to the CP 220, which generates an output current representing the phase difference between the reference clock and the virtual feedback clock of the timing specified by the value of $\epsilon$. The CP 220 works in a manner in accordance with the embodiment of CP 500 illustrated in FIG. 5. The value of $\epsilon$ is used to control the magnitudes of two current sinks within the CP 500 (see current sinks 523 and 525 in FIG. 5). As described above, the total net charge delivered by CP 510 is zero as long as the parameter $\epsilon$ is correctly specified.

In practice, it is difficult to control the magnitude of a current sink to a very high resolution. For those of ordinary skill in the art, a delta-sigma modulator may be introduced to replace the unit delay 650 in FIG. 6 to modulate the residual phase error $\epsilon$. The introduced delta-sigma modulator reduces the resolution of the residual phase error $\epsilon$ to allow an easier implementation of controlling the magnitude for the two current sinks thereof. The method of performing a delta-sigma modulation on a signal to reduce its resolution is well known in prior art and thus not described here in detail.

Figure 7:
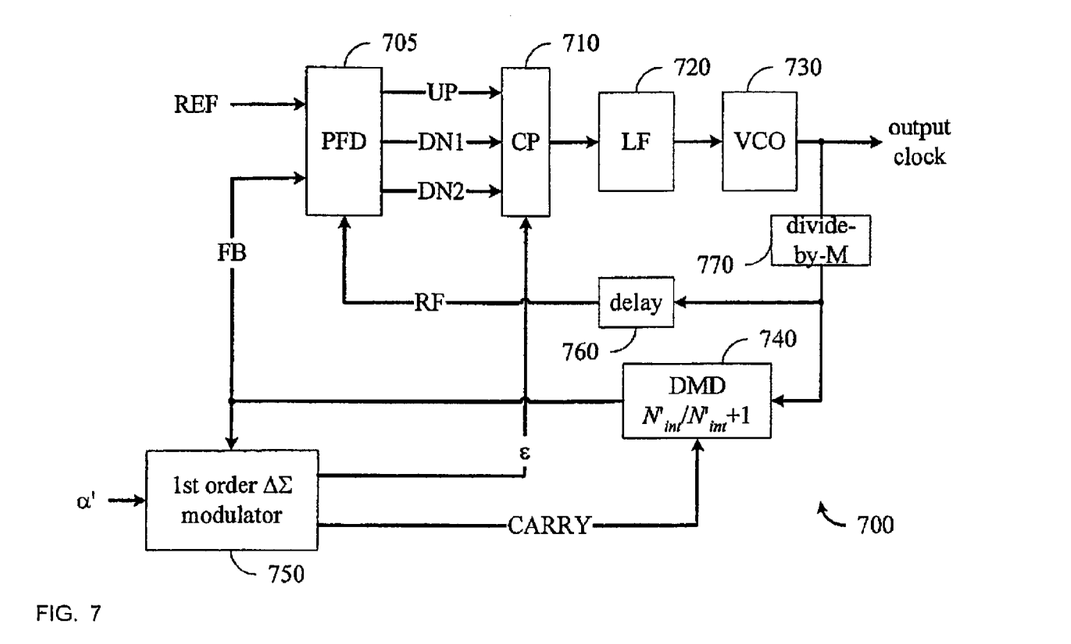
FIG. 7 shows a fractional-N frequency synthesizer in accordance with another embodiment of the present invention.

In the embodiment illustrated in FIG. 2, the RF clock is the same as the output clock of the VCO 240 except for a fixed delay. In practice, the frequency of output clock of the VCO 240 (and therefore the frequency of the RF clock) may be very high so that the PFD 210 circuit, which uses the RF clock to trigger a few flip-flops thereof, may be too difficult to implement. An alternative embodiment shown in FIG. 7 may be employed to alleviate this problem. The fractional-N synthesizer 700 in FIG. 7 is the same as the fractional-N synthesizer 200 in FIG. 2 except for the following changes: (1) a divide-by-M circuit 770 is inserted to divide down the output clock from the VCO 730 by a factor of M, where M is a positive integer that may be conveniently chosen from but not limited to a power of two; (2) both the delay circuit 760 and the DMD 740 receive their input from the output of the divide-by-M circuit 770, as opposed to directly from the output of the VCO 730; (3) the DMD 740 now has the two values $N'_{int}$ and $N'_{int}+1$, where $N'_{int}$=floor(N/M); and (4) the input to the $\Delta\Sigma$ modulator 750 is $\alpha'$, where $\alpha'$=N/M-floor(N/M).

For those of ordinary skill in the art, a higher order delta-sigma modulator may be used to shuffle the divisor value. In this case, the DMD (250 in FIG. 2 or 740 in FIG. 7) may be changed to a MMD (multi-modulus divider) that has more than two possible divisor values. Also, the residual phase error $\epsilon$ will be no longer bounded within one RF clock cycle. Therefore, we should insert more data flip-flops, clocked by the RF clock, between DFF 314 and DFF 316 in FIG. 3. However, using a higher order delta-sigma modulator takes more hardware but yet offers few advantage, as embodiments should accurately estimate the phase error, rather than shuffle the phase error.

Figure 8:
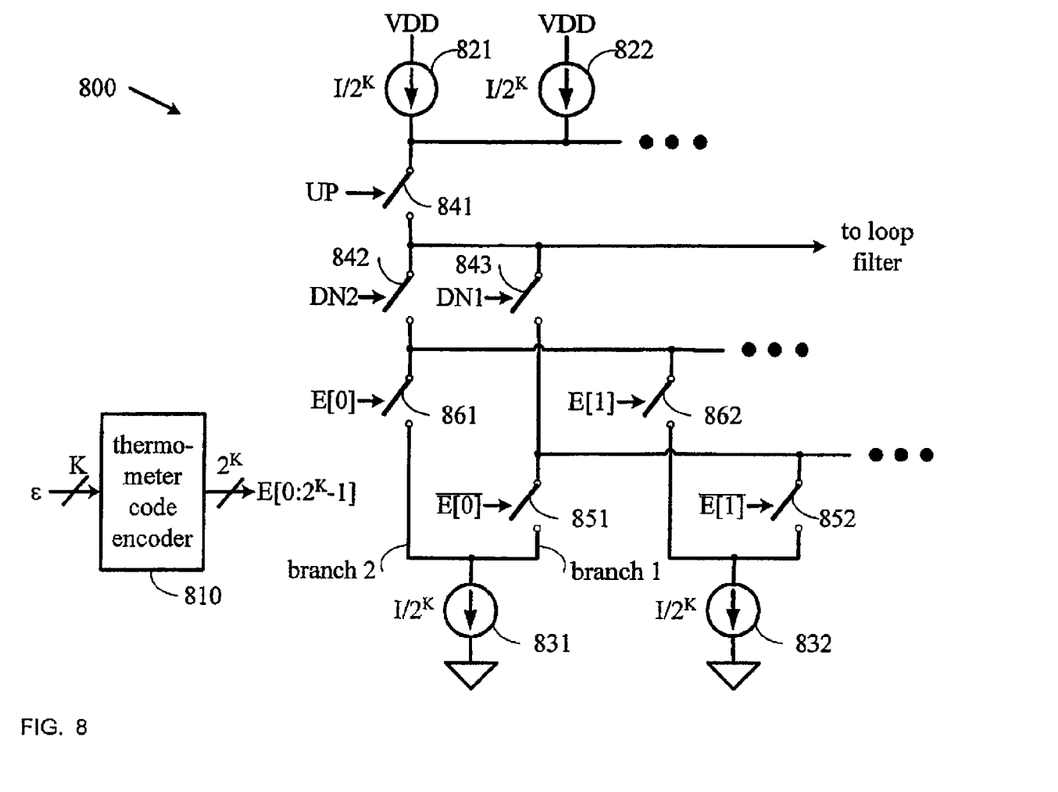
FIG. 8 shows an implementation of the embodiment charge pump (CP) in FIG. 5.

In the CP 500 illustrated in FIG. 5, there are a current source 521 of magnitude I, a current sink 523 of magnitude $\epsilon \cdot I$, and a current sink 525 of magnitude $(1-\epsilon) \cdot I$. The parameter $\epsilon$ is a finite-length digital word, the K-bit digital word, where K>1. One observes that the total current from both current sinks 523 and 525 is I, which is the same as the magnitude of the current source 521. One thus may implement current sinks 523 and 525 using a "current steering" approach by sinking a constant current of magnitude I from two branches: one for implementing current sink 523, and the other for current sink 523. FIG. 8 illustrates a CP 800 that is implemented in this manner. In this embodiment, a thermometer code encoder 810 is used to encode the K-bit digital word into a $2^K$-bit thermometer code, denoted as $E[0:2^K-1]$. The current source of magnitude I is implemented by $2^K$ current sources, labeled 821, 822, and so on, each having a magnitude of $I/2^K$. The current outputs of all current sources are connected to the loop filter via switch 841 controlled by the UP signal. Similarly, there are $2^K$ current sinks, labeled 831, 832, and so on, each sinking a current of magnitude $I/2^K$. Each current is accompanied by a steering circuit comprising two branches controlled by one of the $2^K$-bit thermometer code and its logic inversion via two switches. For example, the steering circuit accompanying current sink 831 includes two branches: branch 1 and branch 2, and two switches: 851 and 861. When E[0] is 1, the current sink 831 steers to branch 2 through switch 861; when E[0] is 0, the current steers to the branch 1 through switch 851. The current outputs of branch 1 from all current steering circuits are connected to the loop filter via switch 843 controlled by the DN1 signal. Similarly, the current outputs of branch 2 from all current steering circuits are connected to the loop filter via switch 842 controlled by the DN2 signal. In this manner, a total current of I is sourced to the loop filter when the UP signal is asserted; a total current of $(1-\epsilon) \cdot I$ is sunk from the loop filter when the DN1 signal is asserted; and a total current of $\epsilon \cdot I$ is sunk from the loop.

In a further embodiment, a switch capacitor loop filter, implemented in accordance with a method disclosed by another application titled "Switch capacitor loop filter for phase lock loop", U.S. patent application Ser. Nos. 60/741,119 and 11/601,303, which is incorporated by reference, is used to replace the loop filter (LF 230 in FIG. 2 or LF 720 in FIG. 7) to further improve the performance of the fractional-N synthesizer.

Figure 9:
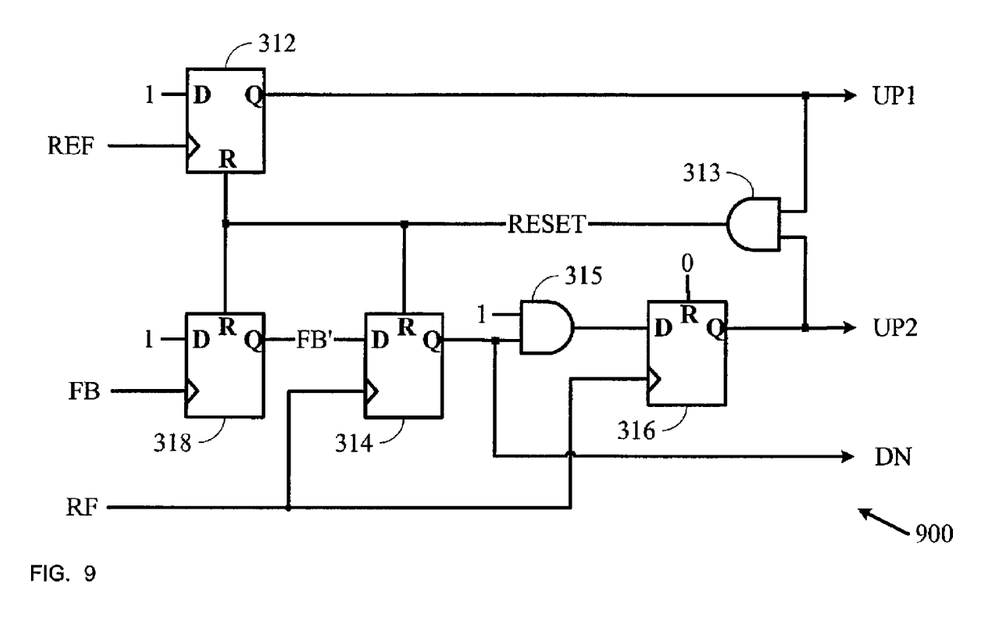
FIG. 9 shows a phase frequency detector (PFD) in accordance with an embodiment of the present invention.

For those of ordinary skill in the art, the principle disclosed by the present invention can be practiced in various alternative forms. FIG. 9 depicts an alternative phase frequency detector (PFD) embodiment 900, which is similar to PFD 300 in FIG. 3 except for the following changes: (1) the output of DFF 312 is connected to a node for signal UP1 (instead of UP), (2) the output of DFF (data flip flop) 314 is connected to a node for the DN signal (instead of DN1), (3) DFF 316 is no longer reset by the RESET signal (e.g., a non-enable or "0" signal is provided to the reset input R), and (4) the output of DFF 316 is connected to a node for the UP2 signal (instead of DN2). In steady state of this embodiment, the pulse length of UP1 is $((1-\epsilon)T_{RF}+\delta)$; the pulse length of UP2 is $T_{RF}$; and the pulse length of DN is $(T_{TF}+\delta)$.

Figure 10:
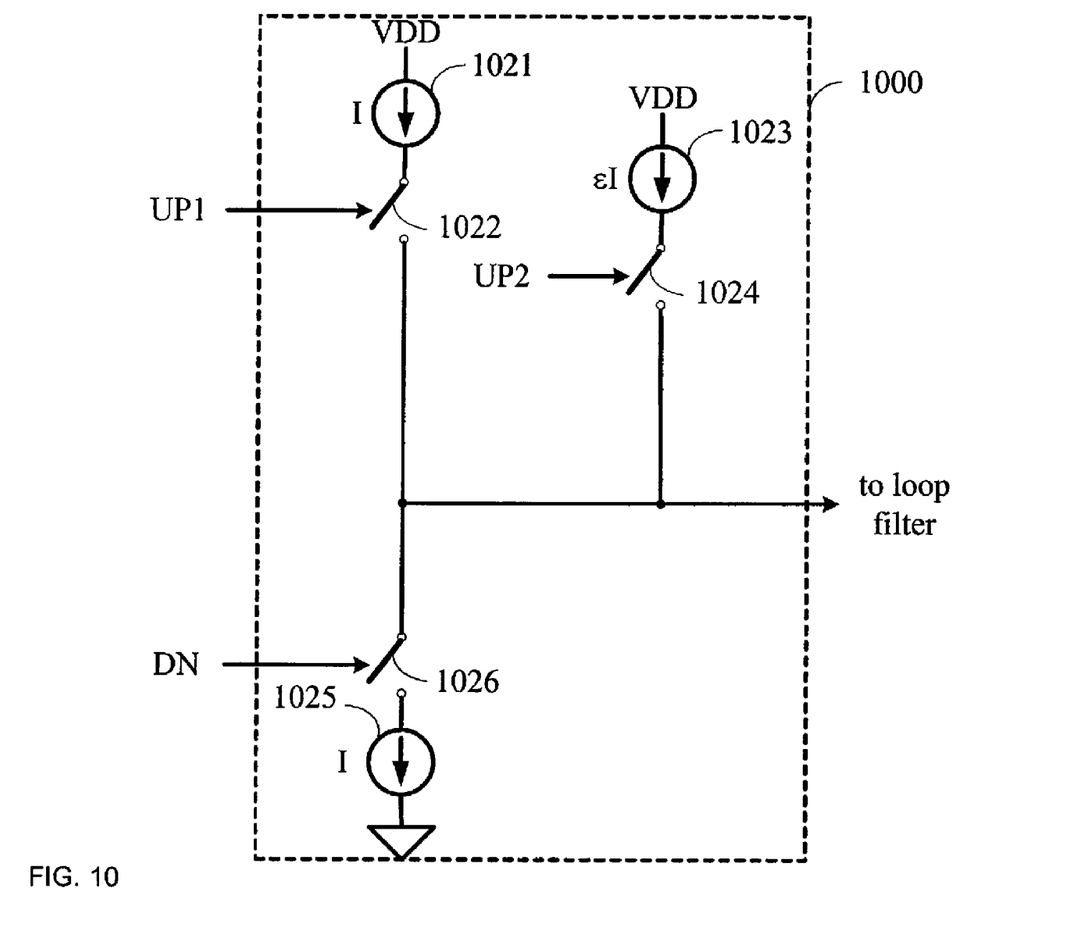
FIG. 10 shows a charge pump (CP) in accordance with an embodiment of the present invention.

FIG. 10 depicts a charge pump (CP) circuit 1000 working in conjunction with PFD 900. CP 1000 includes: a first current source 1021 of magnitude I, enabled by a first switch 1022 controlled by the UP1 signal; a second current source 1023 of magnitude $\epsilon \cdot$I, enabled by a second switch 1024 controlled by the UP2 signal; and a current sink 1025 of magnitude I, enabled by a third switch 1026 controlled by the DN signal. In steady state of this embodiment, the total charge injected by current source 1021 is $I((1-\epsilon)T_{RF}+\delta)$; the total charge injected by current source 1023 is $\epsilon \cdot I \cdot T_{RF}$; and the total charge drained by current sink 1025 is $I(T_{RF}+\delta)$. Accordingly, the total charge injected by current sources 1021 and 1023 will be cancelled by the total charge drain by current sink 1025.

Figure 11:
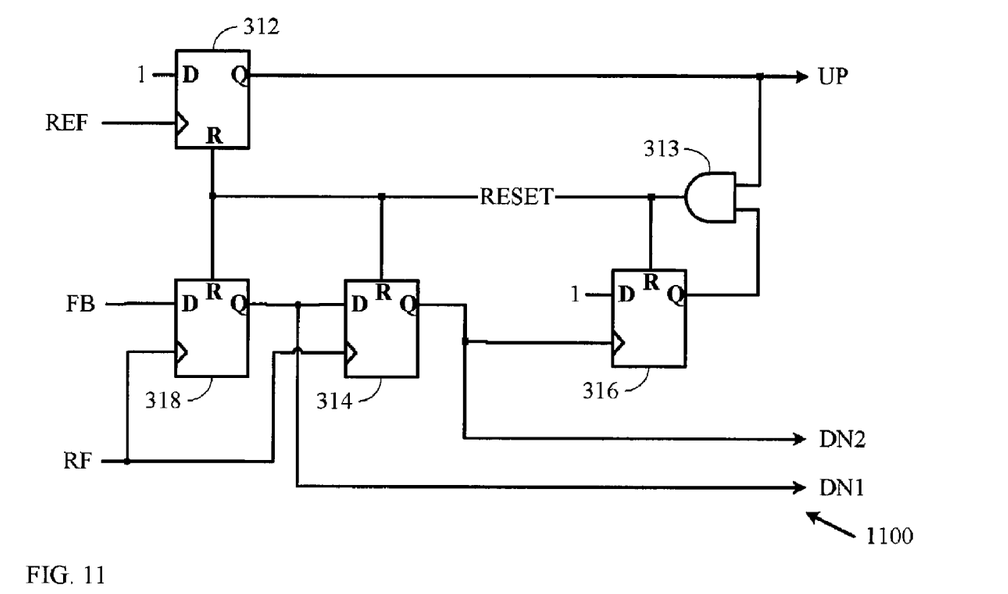
FIG. 11 shows an embodiment of phase frequency detector (PFD).

There are some alternative embodiments of PFD circuits in accordance with the present invention. For instance, FIG. 11 depicts a phase frequency detector (PFD) circuit 1100 that functions equivalently to the PFD circuit 300 of FIG. 3. PFD circuit 1100 has exactly the same circuit elements as PFD circuit 300 of FIG. 3, ignoring the optional AND gate 315; they differ only in the inter-connection between signals. The differences are highlighted as follows. In FIG. 11: the DFF 318 samples the feedback signal FB (instead of sampling the constant input 1) at a rising edge of the RF signal; the DN1 signal is taken from the output of DFF 318 (instead of from the output of the DFF 314); DFF 316 samples the constant input 1 (instead of the DN1 signal, barring the delay from the optional AND gate 315) at a rising edge of the DN2 signal (instead of the RF signal); and the DN2 signal is taken from the output of DFF 314 (instead of the output of the DFF 316). The resultant waveforms of DN1 and DN2 are exactly the same as those described above with regard to FIG. 3.

Figure 12:
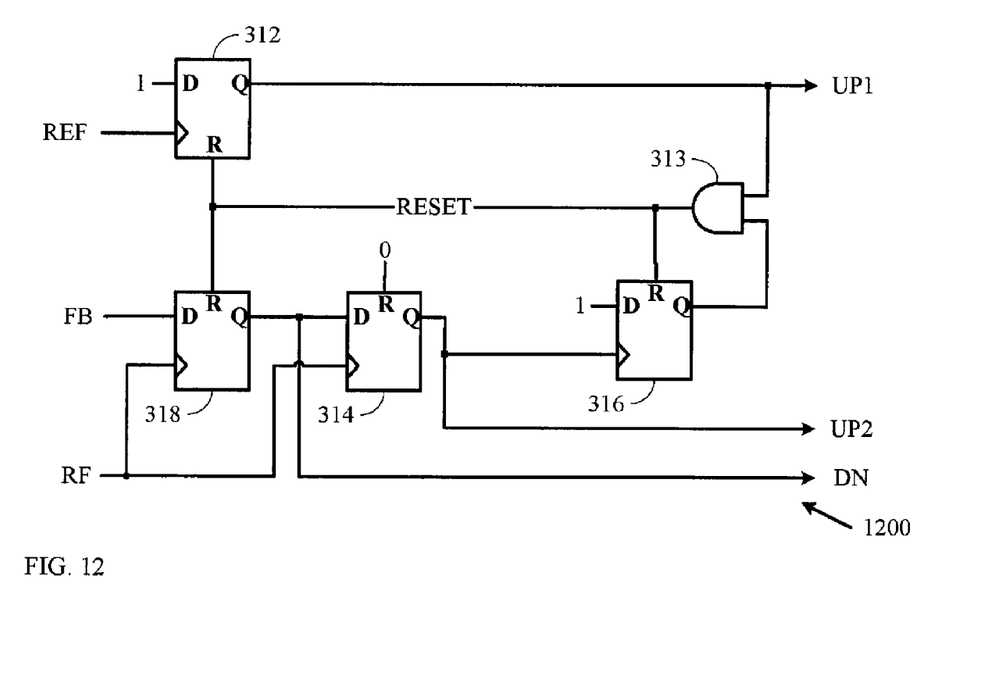
FIG. 12 shows an embodiment of phase frequency detector (PFD).

FIG. 12 depicts a phase frequency detector (PFD) circuit 1200 that functions equivalently to the PFD circuit 900 of FIG. 9. PFD circuit 1200 has exactly the same circuit elements as PFD circuit 900 of FIG. 9, ignoring the optional AND gate 315; they differ only in the inter-connection between signals. The differences are highlighted as follows. In FIG. 12: the DFF 318 samples the feedback signal FB (instead of sampling the constant input 1) at a rising edge of the RF signal; the DN signal is taken from the output of DFF 318 (instead of from the output of the DFF 314); DFF 316 samples the constant input 1 (instead of the DN signal, barring the delay from the optional AND gate 315) at a rising edge of the UP2 signal (instead of the RF signal); and the UP2 signal is taken from the output of DFF 314 (instead of the output of the DFF 316). The resultant waveforms of UP1 and UP2 are exactly the same as those described above with regard to FIG. 9.

In FIG. 3, FIG. 9, FIG. 11, and FIG. 12, a PFD comprises a first flip-flop (DFF 312) and a flip-flop train comprising a second flip-flop (DFF 318), a third flip-flop (DFF 314), and a fourth flip-flop (DFF 316). To those of ordinary skill in the art, more flip-flops can be asserted in the flip-flop train without departing from the principle taught by the present invention.

In general, a PFD, which receives a reference clock, a feedback clock, and a RF clock, and is used to generate three logical signals to control a charge pump. In an embodiment, the charge pump includes two current sources and one current sink. In an embodiment, the charge pump includes two current sinks and one current source. In any case, each of the current source/sink devices is controlled by a respective logical signal, and at least one of the current/sink devices has an adjustable magnitude controlled by a parameter $\epsilon$.

Various modifications may be made to the disclosed embodiments without departing from the scope of the invention as claimed below. For example, in the description of the embodiment in FIG. 3, it was stated that the various signals UP, DN1, and DN2 are asserted or de-asserted under various conditions. Implied in FIG. 3 is that a signal is brought HIGH when it is asserted, and is brought LOW when it is de-asserted. However, in other embodiments, the meaning of asserting and de-asserting may be changed, so that a signal may be asserted when it is brought LOW and de-asserted when it is brought HIGH. It is relatively straightforward to one skilled in the art of circuit design to design circuits in such a way that an embodiment PFD may be realized in which a signal is brought HIGH when it is asserted, and brought LOW when it is de-asserted. Accordingly, when considering the scope of the claims below, in which the terms asserted and de-asserted are used, unless otherwise stated, asserting a signal means that the signal is brought a logic level, and de-asserting a signal means that the signal is brought to a logic level complementary to that when asserted.

Although thus far in this disclosure we have distinguished a "current source" from a "current sink", it should be understood that in an alternative nomenclature a "current sink" can also be described as a "current source," only that the output current has a negative sign.

It is to be understood in these letters patent that the meaning of "A is connected to B", where A or B may be, for example, a node or device terminal, is that A and B are connected to each other so that the voltage potentials of A and B are substantially equal to each other. For example, A and B may be connected by way of an interconnect, for example. In integrated circuit technology, the interconnect may be exceedingly short, comparable to the device dimension itself. For example, the gates of two transistors may be connected to each other by polysilicon or copper interconnect that is comparable to the gate length of the transistors. As another example, A and B may be connected to each other by a switch, such as a transmission gate, so that their respective voltage potentials are substantially equal to each other when the switch is ON.

It is also to be understood in these letters patent that the meaning of "A is coupled to B" is that either A and B are connected to each other as described above, or that, although A and B may not be connected to each other as described above, there is nevertheless a device or circuit that is connected to both A and B. This device or circuit may include active or passive circuit elements, where the passive circuit elements may be distributed or lumped-parameter in nature. For example, A may be connected to a circuit element which in turn is connected to B.

It is also to be understood in these letters patent that a "current source" may mean either a current source or a current sink. Similar remarks apply to similar phrases, such as, "to source current".

It is also to be understood in these letters patent that various circuit blocks, such as current mirrors, amplifiers, etc., may include switches so as to be switched in or out of a larger circuit, and yet such circuit blocks may still be considered connected to the larger circuit because the various switches may be considered as included in the circuit block.

Various mathematical relationships may be used to describe relationships among one or more quantities. For example, a mathematical relationship or mathematical transformation may express a relationship by which a quantity is derived from one or more other quantities by way of various mathematical operations, such as addition, subtraction, multiplication, division, etc. Or, a mathematical relationship may indicate that a quantity is larger, smaller, or equal to another quantity. These relationships and transformations are in practice not satisfied exactly, and should therefore be interpreted as "designed for" relationships and transformations. One of ordinary skill in the art may design various working embodiments to satisfy various mathematical relationships or transformations, but these relationships or transformations can only be met within the tolerances of the technology available to the practitioner.

Accordingly, in the following claims, it is to be understood that claimed mathematical relationships or transformations can in practice only be met within the tolerances or precision of the technology available to the practitioner, and that the scope of the claimed subject matter includes those embodiments that substantially satisfy the mathematical relationships or transformations so claimed.

I claim:

1. A circuit comprising:
a voltage-controlled oscillator comprising an output port to provide an output clock signal, the circuit to provide a first feedback signal derived from the output clock signal;
a divider circuit to provide a second feedback signal derived from the output clock signal divided by N+1 with a probability $\alpha$ and divided by N with a probability $1-\alpha$, where N is an integer; and
a phase frequency detector to provide a first logic signal that is asserted at a rising edge of the reference signal, and to provide a second logic signal that is asserted at a rising edge of the second feedback signal, the phase frequency detector to sample the second logic signal at a rising edge of the first feedback signal to generate a third logic signal, where the third logic signal is sampled at a rising edge of the first feedback signal to generate a reset signal, where the first, second, and third signals are de-asserted after both the first and reset signals are asserted.

2. The circuit as set forth in claim 1, further comprising a charge pump circuit responsive to the first, second, and third logic signals, and a parameter signal, the parameter signal representing a parameter in magnitude less than one, the charge pump circuit comprising:
a first current source to provide a current only if the first logic signal is asserted;
a second current source to provide a current equal in value to the parameter multiplied by the value of the current of the first current source only if the second logic signal is asserted; and
a third current source to provide a current equal in value to the value of the current of the first current source minus the value of the current of the second current source only if the third logic signal is asserted.

3. The circuit as set forth in claim 2, further comprising a sigma-delta modulator, the sigma-delta modulator comprising:
an output port to provide an output logic signal having a first Boolean value with probability $\alpha$ and a second Boolean value with probability $1-\alpha$;
a summation element to provide an output signal representative of the output logic signal subtracted from a signal representative of the probability $\alpha$; and
an integrator element to provide an output signal representative of an integration of the output signal of the summation element;

where the output logic signal of the sigma-delta modulator is a truncation of the output signal of the integrator element.

4. The circuit as set forth in claim 3, further comprising a second summation element to provide an output signal representative of the output logic signal of the sigma-delta modulator subtracted from the output signal of the integrator element; and
a delay element to delay the output signal of the second summation element to provide the parameter signal.

5. The circuit as set forth in claim 1, further comprising a delay element comprising an input port connected to the output port of the voltage-controlled oscillator, and comprising an output port to provide the first feedback signal.

6. The circuit as set forth in claim 1, further comprising:
a second divider circuit comprising an output port to provide on its output port the output clock signal divided by an integer M; and
a delay element to comprising an input port connected to the output port of the second divider circuit and comprising an output port to provide the first feedback signal.

7. The circuit as set forth in claim 1, wherein any one of the first, second, or third logic signal, or the reset signal, is brought HIGH when asserted and is brought LOW when de-asserted.

8. A circuit comprising:
a loop filter;
a charge pump responsive to a first logic signal, a second logic signal, a third logic signal, and a signal indicative of a parameter $\epsilon$, where $0 \leq \epsilon \leq 1$, to source to the loop, a first amount charge, a second amount of charge, and a third amount of charge only if the first, the second, and third logic signals are asserted, respectively, wherein the sum of the first, second, and third amounts of charge is substantially zero regardless of the parameter $\epsilon$;
a voltage-controlled oscillator coupled to the loop filter to provide an output clock signal; and
a phase frequency detector responsive to a reference signal, a first feedback signal derived from the output clock signal, and a second feedback signal derived from the output clock signal and a parameter $\alpha$, the phase frequency detector to provide the first, second, and third logic signals to the charge pump.

9. The circuit as set forth in claim 8, further comprising a divider, circuit to provide the second feedback signal by dividing the output clock signal by a divisor D, where D changes over time to take on a value N with a first steady state frequency and to take on a value N+1 with a second steady state frequency, where N is an integer, where the first and second steady state frequencies are set by the parameter $\alpha$.

10. The circuit as set forth in claim 9, wherein the phase frequency detector asserts the first logic signal at a rising edge of the reference signal, and asserts the second logic signal at a rising edge of the second feedback signal, wherein the phase frequency detector samples the second logic signal at a rising edge of the first feedback signal to generate the third logic signal, where the third logic signal is sampled at a rising edge of the first feedback signal to generate the reset signal, and where the first, second, and third signals are de-asserted after both the first and reset signals are asserted.

11. The circuit as set forth in claim 10, wherein any of the first logic signal, second logic signal, third logic signal, and reset signal is brought HIGH when asserted and is brought LOW when de-asserted.

12. The circuit as set forth in claim 9, the divider circuit comprising an input port having an input logic signal representative of a Boolean variable CARRY so that D takes on the value N when CARRY is a Boolean 0 and D takes on the value N+1 when CARRY is a Boolean 1, the circuit further comprising a modulator comprising:

a first summer comprising an output port to provide a signal representing $\alpha$+CARRY;

an integrator to comprising an input port connected to the output port of the first summer and comprising an output port;

a truncate functional unit comprising an input port connected to the output port of the integrator and comprising an output port to provide the input logic signal representing CARRY;

a second summer comprising a first input port connected to the output port of the integrator, a second input port connected to the output port of the truncate functional unit, and an output port; and a delay element comprising a first input port to the output of the second summer and an output port to provide a signal representing the parameter $\epsilon$.

13. The circuit as set forth in claim 12, wherein the phase frequency detector asserts the first logic signal at a rising edge of the reference signal, and asserts the second logic signal at a rising edge of the second feedback signal, wherein the phase frequency detector samples the second logic signal at a rising edge of the first feedback signal to generate the third logic signal, where the third logic signal is sampled at a rising edge of the first feedback signal to generate the reset signal, and where the first, second, third, and reset signals are de-asserted after both the first and reset signals are asserted.

14. The circuit as set forth in claim 8, wherein the phase frequency detector asserts the first logic signal at a rising edge of the reference signal, and asserts the second logic signal at a rising edge of the second feedback signal, wherein the phase frequency detector samples the second logic signal at a rising edge of the first feedback signal to generate the third logic signal, where the third logic signal is sampled at a rising edge of the first feedback signal to generate the reset signal, and where the first, second, third, and reset signals are de-asserted after both the first and reset signals are asserted.

15. The circuit as set forth in claim 8 further comprising:
a divider circuit to divide the output clock signal by an integer M; and
a delay element coupled to the divider circuit to provide the first feedback signal.

16. The circuit as set forth in claim 8, the loop filter comprising a capacitor and a resistor in series with the capacitor.

\* \* \* \* \*

UNITED STATES PATENT AND TRADEMARK OFFICE
CERTIFICATE OF CORRECTION

PATENT NO. : 7,498,856 B2
APPLICATION NO. : 11/564173
DATED : March 3, 2009
INVENTOR(S) : Lin et al.

It is certified that error appears in the above-identified patent and that said Letters Patent is hereby corrected as shown below:

On the title page, item (74), in "Attorney, Agent, or Firm", in column 2, line 1, delete "Lunberg" and insert -- Lundberg --, therefor.

On the title page, item (57), under "Abstract", in column 2, line 8, delete "lockup" and insert -- locked --, therefor.

On the title page, item (57), under "Abstract", in column 2, line 8, after "loop" insert -- having a --, therefor.

In column 12, line 46, in Claim 9, delete "divider," and insert -- divider --, therefor.

In column 13, line 6, in Claim 12, delete "$\alpha$+CARRY;" and insert -- $\alpha$-CARRY; --, therefor.

Signed and Sealed this

Sixteenth Day of June, 2009

JOHN DOLL
*Acting Director of the United States Patent and Trademark Office*